US007726842B2

(12) United States Patent
Hsieh

(10) Patent No.: US 7,726,842 B2
(45) Date of Patent: Jun. 1, 2010

(54) OPTIMUM STRUCTURE FOR SINGLE-SIDES PCB WITH SMD LEDS FOR THE EXPRESS CARD

(75) Inventor: Yu-Lin Hsieh, Hukou Township, Hsinchu County (TW)

(73) Assignee: Gemtek Technology Co., Ltd., Hsinchu (TW)

( * ) Notice: Subject to any disclaimer, the term of this patent is extended or adjusted under 35 U.S.C. 154(b) by 252 days.

(21) Appl. No.: 11/905,802

(22) Filed: Oct. 4, 2007

(65) Prior Publication Data

US 2009/0091896 A1     Apr. 9, 2009

(51) Int. Cl.
*F21V 33/00* (2006.01)
*H05K 5/00* (2006.01)

(52) U.S. Cl. .................. 362/253; 362/249.02; 362/234; 361/752

(58) Field of Classification Search ............ 362/249.02, 362/234, 253, 800; 361/752; 29/832; 438/28
See application file for complete search history.

(56) References Cited

U.S. PATENT DOCUMENTS

2005/0114587 A1* 5/2005 Chou et al. .................. 711/103

* cited by examiner

*Primary Examiner*—Bao Q Truong
(74) *Attorney, Agent, or Firm*—Muncy, Geissler, Olds & Lowe, PLLC

(57) ABSTRACT

The present invention discloses a structure of a single-sided PCB within an ExpressCard with SMD LEDs arrangement formed thereon. The SMD LEDs are act as status indicators for the electronic devices with small, thin and compact size. The structure is expected to form SMD LED illuminating light to the top surface of the PCB with SMD LEDs connecting to the bonding pads on the bottom surface of the PCB. The method comprises forming through-holes on the PCB, placing SMD LEDs over the through-holes with their illuminating heads facing toward the top surface of the PCB, soldering the SMD LEDs with the bonding pads on the bottom surface of the PCB.

9 Claims, 3 Drawing Sheets

OPTIMUM STRUCTURE FOR SINGLE-SIDES PCB WITH SMD LEDS FOR THE EXPRESS CARD

FIELD OF THE INVENTION

The present invention relates to a structure of a PCB (printed circuit board) in ExpressCard, and more particularly to a structure of a single-sided PCB within ExpressCard with SMD LEDs (surface-mount device light emitted diode) bonded on the bottom surface of the PCB and with it's light emitting portion heading toward the top surface of the PCB.

DESCRIPTION OF THE PRIOR ART

ExpressCard is a brand new functional expansion module presented by PCMCIA (personal computer memory card international association) based on standards of PCI Express and USB 2.0. In comparison, ExpressCard module has hyper data transmission speed, thinner design and lower production cost, and can also easily accommodate to the existing computer systems and the portable devices. Current application of ExpressCard module includes memory card adapter, external SATA adapter (eSATA), digital TV card, FireWire expansion card, Wi-Fi wireless adapter or WWAN ExpressCard, etc.

According to ExpressCard Standard, the ExpressCard's mechanical outline is shown in FIG. 1, FIG. 2 and FIG. 3. FIG. 3 shows the ExpressCard's highness is 4 mm and the extended part A is 1 mm.

Conventionally, most SMD chips and SMD LEDs used in the ExpressCard are mounted on the top surface of the PCB. However, this kind of circuit layout doesn't use the extended part A effectively, besides, the double-sided PCB (i.e. both surfaces of PCB, top and bottom, have circuit layout thereon) needs extra procedures in semiconductor manufacture processes to produce and more costly than the single-sided PCB. Thus, the design of prior art increases the product cost of the ExpressCard and doesn't utilize the mechanical space of the extended part A effectively.

Referred to FIG. 1, which illustrates a three-dimensional view of a standard ExpressCard 100. The ExpressCard 100 has an top cover 110 and a bottom cover 120, wherein the bottom cover 120 clasps the top cover 110. The ExpressCard 100 is rectangular in shape and provided with two opposite ends, one end is the holding portion 103, and the other end is the inserting portion 104. A power status icon 101 and a transmission status icon 102 are provided in the holding portion 103 on the top cover 110 of the ExpressCard 100, which can indicate the power status and transmission status respectively during the operation of the ExpressCard 100.

Each status icon 101, 102 has corresponding LEDs on the PCB right beneath the cover of the ExpressCard 100. By the illuminating and flickering of the LEDs, Users can obtain the basic information relative to the operation of the ExpressCard 100 from status icons, such as the operation mode, data transmission speed or the error indication, etc. FIG. 2 illustrates the corresponding positions of the ExpressCard 100 inserted into a portable device 201, for example, a notebook or PDA. Note that the status icons 101, 102 face upwardly while inserting to the portable device 201.

Referred to FIG. 3, illustrates the front view of the inserting portion 104 of the ExpressCard 100. The ExpressCard's highness is 4 mm and the extended part A is 1 mm, hence, the total thickness of the ExpressCard 100 is 5 mm. To optimally utilize the space of the extended part A, the present invention discloses a single-sided PCB structure of an ExpressCard with a plurality of SMD chips and SMD LEDs bonded on the bottom surface of the PCB and, wherein the light emitting portion (head) of the SMD LEDs face toward the top surface of the PCB (i.e. facing the top cover of the ExpressCard).

SUMMARY OF THE INVENTION

The object of the present invention is to provide a single-sided PCB for an ExpressCard with a plurality of SMD chips and SMD LEDs bonded on the bottom surface of the PCB to optimum utilize the extended part of the ExpressCard, and wherein the light emitting portions of the SMD LEDs face toward the top surface of the PCB (i.e. heading the top cover of the ExpressCard). The status information is conventionally presented in the form of light illuminating or flickering. Users can obtain the basic status information of the ExpressCard through the illuminating pattern of LED status beneath the status icons, such as the color, flickering frequency, and emitting duration.

The present invention discloses a Wireless ExpressCard with a plurality of status icons on it's cover housing which can indicate the power status and transmission status respectively during the operation of the ExpressCard. Each status icon has a corresponding LED on the PCB right beneath the housing of the ExpressCard. The ExpressCard is used on a portable device, for example, a notebook or a PDA as an expansion module (ex. a memory card, a wireless adapter or an external TV card).

The aspect of present invention is to optimum using the space of mechanical structure of the ExpressCard. Form the SMD chips and SMD LEDs on the bottom surface of the PCB within the ExpressCard, wherein the LED illuminating heads face toward the top surface of the PCB. Pluralities of through-holes are formed through the PCB by drilling machine. The SMD LEDs can be bonded with pads on the bottom surface of the PCB accompanying with the illuminating light pass through the through-holes.

The present invention discloses a method of forming SMD LEDs on a single-sided PCB within an ExpressCard, the method includes the steps of forming through-holes at the interval between two bonding pads on the PCB; and followed by placing the SMD LEDs over the through-holes on the bottom surface of the PCB with illuminating heads of the SMD LEDs facing toward the top surface of the PCB. The third step is to implement a soldering process for bonding cathode contacts of the SMD LEDs with the bonding pads on the bottom surface of the PCB.

In the following preferred embodiment, the LED is a chip type SMD LED whose cathode contacts are disposed at the bilateral sections of the SMD LED whose LED die is packaged on the center of the PCB substrate of the SMD LED. The illuminating head of the SMD LED is dimensioned to fit the through-hole, and the length of the SMD LED is dimensioned to fit the interval between the bonding bonds on the PCB.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

Figure 1:
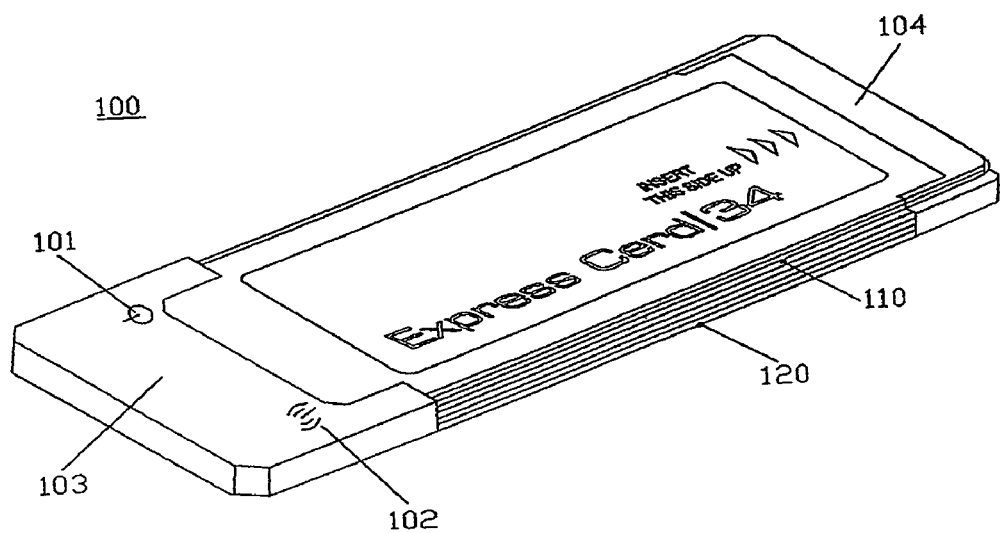
FIG. 1 illustrates the three-dimensional view of a standard express card.
Figure 2:
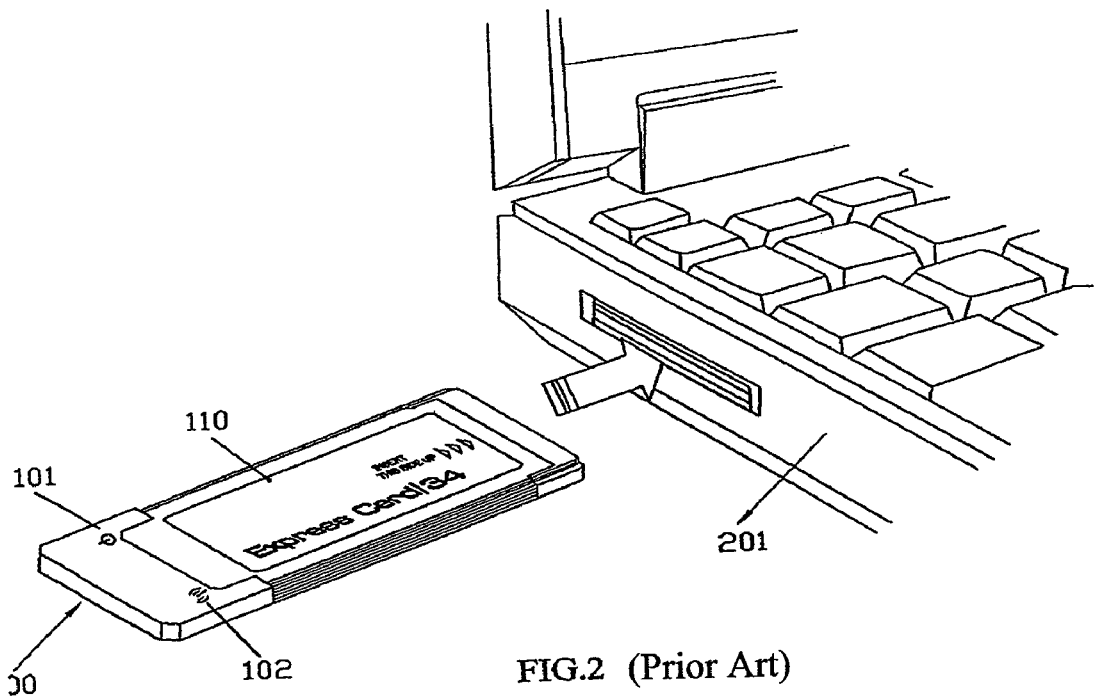
FIG. 2 illustrates the relative positions of an express card and a portable device when inserting.
Figure 3:
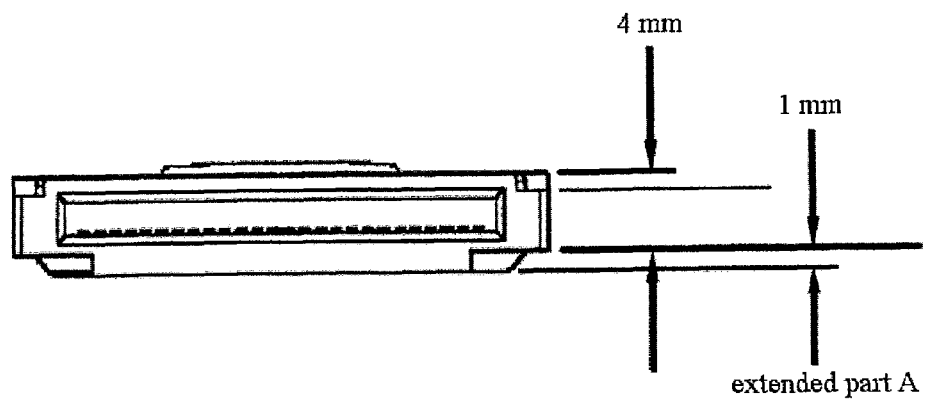
FIG. 3 illustrates the front view of the inserting portion of the ExpressCard according to the prior art.
Figures 4A, 4B:
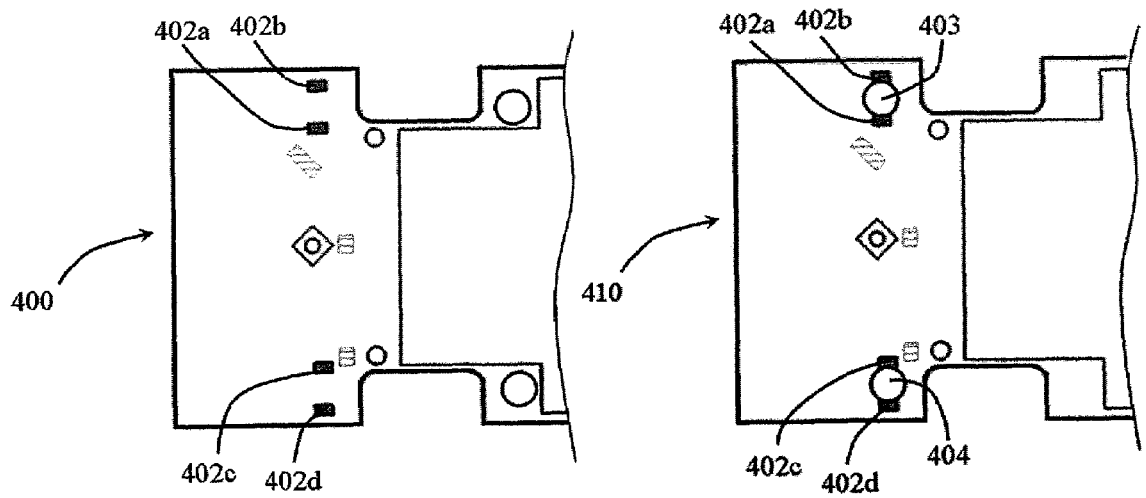
FIG. 4a illustrates the enlarging top view of the PCB within the ExpressCard according to the embodiment in present invention.
FIG. 4b illustrates the enlarging top view of the PCB within the ExpressCard after hole-drilling according to the embodiment in present invention.
Figure 5:
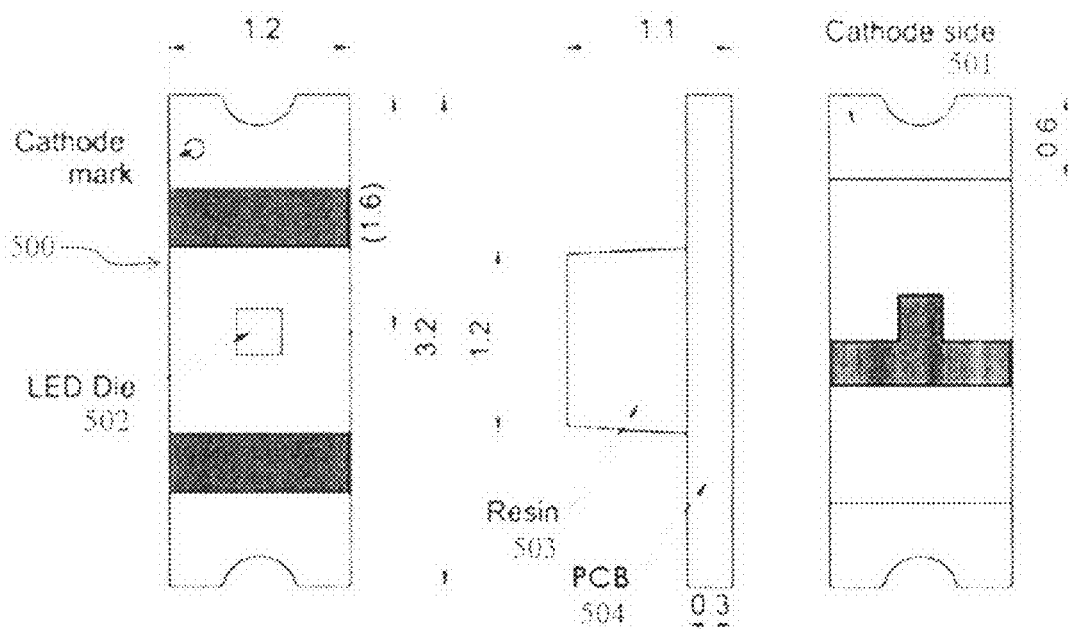
FIG. 5 illustrates the structure of a SMD LED according to the embodiment in present invention.

Referring to FIG. 4a, which is an enlarging top view of the PCB beneath the ExpressCard 100 holding portion 103 according to the present invention. The four shadow areas 402a, 402b, 402c, 402d are the pre-defined bonding pad layout sections on the PCB bottom surface 400. Note that in FIG. 4a, the SMD LEDs 500 (shown in FIG. 5) are not mounted on the bonding pads yet. the SMD LEDs 500 are designed to be positioned on the location right between the two adjacent pads such as pads 402a and 402b as well as pads 402c and 402d. According to the present invention, before bonding the SMD LEDs 500 on the pre-defined pads, two through-holes 403, 404 are formed by using a PCB drilling machine drilling through the PCB from the bottom surface 400 to the top surface 410 of the PCB, as illustrated in FIG. 4b. The positions of through-holes 403, 404 should be precisely on the locations between two adjacent bonding pads 402a, 402b as well as pads 402c, 402d. and the drilling process can't damage the PCB layout. The diameters of through-holes 403, 404 in the embodiment of present invention are about 2.3 mm. This size can allow the illuminating head of the SMD LED 500 lighting source to extend through the PCB. In FIG. 5, shows the SMD LED 500 is provided in the embodiment. The SMD LEDs 500 are specifically dimensioned to fit the diameters of through-holes 403, 404 as well as the intervals between the bonding pads 402a, 402b, 402c, 402d illustrated in FIG. 4a. The SMD LEDs 500 includes four major portions: LED die 502, cathode contact 501, resin block 503 and PCB substrate 504. As shown in FIG. 5, cathode contact 501 is a rectangular portion which is about 0.3 mm in thickness, 0.6 mm in length, 1.2 mm in width formed on PCB substrate 504. Cathode contacts 501 are provided to solder with the pads (i.e. pads 402a~402d) on the PCB bottom surface 400 of the PCB within the ExpressCard 100. LED die 502 is a square semiconductor device packaged on the PCB substrate 504 with a molding material like resin 503 (0.8 mm in thickness), which are illustrated in FIG. 5. The size of LED device 500 is determined by the PCB substrate 504 and encapsulating portion (i.e. Resin block 503). As illustrated in FIG. 5, the length of the PCB substrate 504 is about 3.2 mm, which is quite suitable to the interval (about 3 mm in length) between the bonding pads 402a, 402b as well as pads 402c, 402d in FIG. 4a. The resin block 503 extending from the PCB substrate 504 is 1.2 mm in length which can fit into the through-hole 403, 404 whose diameters are about 2.3 mm. Further, the thickness of resin block 503 is about 0.8 mm, which is substantially equal to the PCB's thickness of the ExpressCard 100 (about 1 mm), thus the illuminating head 503 of SMD LED 500 in the embodiment can extend through the through-hole 403, 404, hence the illuminating light can pass through the through-holes 403, 404 and reach the top surface 410 of the PCB. The lateral sides of the SMT LEDs 500 are designed to bond on the PCB pads 402a, 402b, 402c, 402d, and the light-emitting direction of the SMT LEDs 500 is upright from the LED top surface (i.e. the so-called top-viewed SMD LED).

Figure 6A:
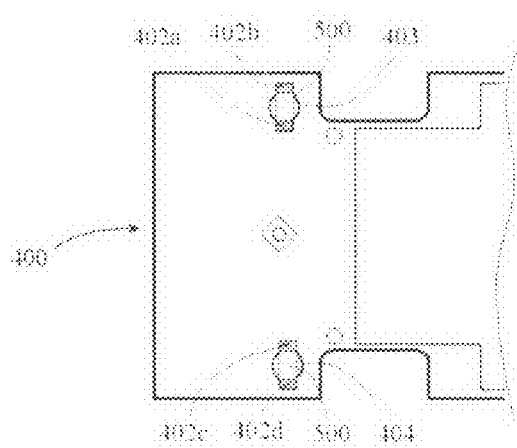
FIG. 6a illustrates the enlarging top view of the PCB under the holding portion of the ExpressCard after the SMD LED bonding according to the present invention.
Figure 6B:
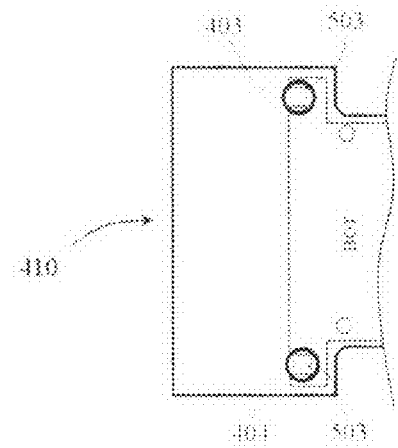
FIG. 6b illustrates the enlarging bottom view of PCB under the ExpressCard's holding portion after the SMD LED bonding according to the present invention

Referred to FIG. 6a, the SMD LEDs 500 illustrated in FIG. 5 are placed on the through-holes 403,404 with their LED die portions 503 heading toward the top surface 410 of the PCB. Once the SMD LEDs 500 are positioned between the bonding pads 402a, 402b, 402c,402d on the bottom surface 400 of the PCB, a soldering process (i.e. wave soldering, IR reflow soldering, convective IR reflow soldering . . . etc) is implemented to bond the cathode contact 501 of the SMD LEDs 500 with the bonding pads (402a~402d), so that the SMD LEDs 500 become electrically connected to the conductive traces on the PCB and also to other proximal or remote electronic devices used for supplying power to, controlling or otherwise interacting electronically with the discrete electronic device. Note that the SMD LEDs 500 showed in the FIG. 6a are with their bottom side facing upwardly (so-called the upside-down LED arrangement). In FIG. 6b, the illuminating light of the illuminating heads 503 of the LEDs 500 can pass through the bottom surface 400 of the PCB to the top surface 410 of the PCB through the through-hole 403, 404. By the aforementioned steps, a SMD LED light source can be formed on the top surface 410 of the PCB and bond with it's pre-defined bonding pads 402a, 402b, 402c, 402d on the bottom surface 400.

With this arrangement in the embodiment of present invention, the single-sided PCB can be adopted in the design of ExpressCard without using the costly double-sided SMT process for PCB. By drilling through-holes and bonding the chip LEDs with the pads formed on the bottom surface of the PCB, the present invention can provide simple manufacture process and lower production cost compared to the prior art.

What is claimed is:

1. An ExpressCard with surface-mount device light emitting diodes mounted therein, comprising:
    a printed circuit board positioned within said ExpressCard having a plurality of through holes;
    a top cover of said ExpressCard having a plurality of status icons formed thereon;
    a bottom cover of said ExpressCard clasping said top cover; and
    said plurality of surface-mount device light emitting diodes bonding with said printed circuit board over said plurality of through holes and beneath said plurality of status icons.

2. The ExpressCard of claim 1, wherein said through-holes are formed between two bonding pads on said printed circuit board.

3. The ExpressCard of claim 1, wherein said plurality of surface-mount device light emitting diodes are chip-type surface-mount device light emitting diodes whose cathode contacts are positioned at the bilateral sections of said surface-mount device light emitting diodes and light emitting diode dies are packaged on the center of substrate of said surface-mount device light emitting diodes.

4. The ExpressCard of claim 1, wherein said surface-mount device light emitting diodes have a plurality of illuminating heads dimensioned to fit and extend into said plurality of through-holes, and the lengths of said surface-mount device light emitting diodes are dimensioned to fit the interval between the bonding pads on said printed circuit board.

5. A method of forming surface-mount device light emitting diodes on a printed circuit board within an ExpressCard, comprising:

forming a plurality of through holes at the position between two adjacent bonding pads on said printed circuit board;

placing said surface-mount device light emitting diodes over said through holes on the bottom surface of said printed circuit board with a plurality of illuminating heads of said surface-mount device light emitting diodes facing and extending to the top surface of said printed circuit board through said through holes; and implementing a soldering process for bonding cathode contacts of said surface-mount device light emitting diodes with said adjacent bonding pads on the bottom surface of said printed circuit board.

6. The method of claim 5, wherein said surface-mount device light emitting diodes are chip type surface-mount device light emitting diodes whose cathode contacts are positioned at the bilateral sections of said surface-mount device light emitting diodes and light emitting diode dies are packaged on the center of printed circuit board substrate of said surface-mount device light emitting diodes.

7. The method of claim 5, wherein said plurality of illuminating heads of said surface-mount device light emitting diodes are dimensioned to fit for said through-holes, and the length of said surface-mount device light emitting diodes are dimensioned to fit the interval between the bonding pads on said printed circuit board.

8. The method of claim 5, wherein said through-holes are formed by using a printed circuit board drilling machine.

9. The method of claim 5, wherein said soldering process includes wave soldering, IR reflow soldering, convective IR reflow soldering, vapor phase reflow soldering, or hand soldering.

\* \* \* \* \*